(12) United States Patent
Ishihara

(10) Patent No.: US 6,593,861 B2
(45) Date of Patent: Jul. 15, 2003

(54) DATA COMPRESSION TECHNIQUES FOR REDUCING ENCODING BITS

(75) Inventor: Seiji Ishihara, Saitama (JP)

(73) Assignee: Ricoh Co., LTD, Tokyo (JP)

( * ) Notice: Subject to any disclaimer, the term of this patent is extended or adjusted under 35 U.S.C. 154(b) by 0 days.

(21) Appl. No.: 10/247,245

(22) Filed: Sep. 19, 2002

(65) Prior Publication Data

US 2003/0058142 A1 Mar. 27, 2003

(30) Foreign Application Priority Data

Sep. 21, 2001 (JP) .................................... 2001-289783
Mar. 8, 2002 (JP) .................................... 2002-063071

(51) Int. Cl.$^7$ ................................................ H03M 7/00
(52) U.S. Cl. ........................... 341/61; 341/51; 341/87
(58) Field of Search ............................ 341/61, 51, 87, 341/107, 89, 95

(56) References Cited

U.S. PATENT DOCUMENTS

| 5,659,635 A | * | 8/1997 | Komatsu et al. ............. 382/245 |
| 5,963,672 A | * | 10/1999 | Yajima et al. ............... 382/238 |
| 6,404,919 B1 | * | 6/2002 | Nishigaki et al. ............ 382/176 |
| 6,429,972 B1 | * | 8/2002 | Ota et al. .................... 359/569 |

* cited by examiner

Primary Examiner—Michael Tokar
Assistant Examiner—John Nguyen
(74) Attorney, Agent, or Firm—Knoble & Yoshida, LLC

(57) ABSTRACT

Data compression techniques reduce a number of encoding words for compressing data. One technique is to assign a common encoding word to a group of data whose activation sequence is pre-selected. Another technique is to assign an encoding word to a pair of converted data. Yet another technique is to assign an encoding word that is indicative of the length of the repletion in the converted word. The above assignments substantially reduces a number of encoding words for the converted words in a process of data compression.

30 Claims, 8 Drawing Sheets

FIG. 5

| POSITION (K) | | 0 | 1 | 2 | 3 | 4 | 5 |
|---|---|---|---|---|---|---|---|
| SIGNAL ($S_k$) | | 00 | 11 | 01 | 11 | 00 | 00 |
| DICTIONARY REGISTRATION ORDER AND RANK SIGNAL | RANK (r) | SIGNAL | | | | | |
| | 0 | 00 | 00 | 11 | 01 | 11 | 00 |
| | 1 | 01 | 01 | 00 | 11 | 01 | 11 |
| | 2 | 10 | 10 | 01 | 00 | 00 | 01 |
| | 3 | 11 | 11 | 10 | 10 | 10 | 10 |
| CONVERTED SIGNAL ($t_k$) | | 0 | 3 | 2 | 1 | 2 | 0 |

FIG. 8

| POSITION (K) | 0 | 1 | 2 | 3 | 4 | 5 | ... |
|---|---|---|---|---|---|---|---|
| CONVERTED SIGNAL ($T_k$) | 0 | 3 | 2 | 1 | 2 | 0 | ... |
| DICTIONARY REGISTRATION ORDER AND RANK SIGNAL | ORDER | SIGNAL VALUE | | | | | |
| | 0 | 00 | 00 | 11 | 01 | 11 | 00 | ... |
| | 1 | 01 | 01 | 00 | 11 | 01 | 11 | ... |
| | 2 | 10 | 10 | 01 | 00 | 00 | 01 | ... |
| | 3 | 11 | 11 | 10 | 10 | 10 | 10 | ... |
| PREDICTION: O=ESTABLISHED —=NOT ESTABLISHED OR NOT APPLICABLE | — | — | — | — | O | — | |
| REGISTRATION ORDER (C) OF INVERSELY CONVERTED VALUE OF RECENT PRECEDING PREDETERMINED SIGNAL 0 | — | 0 | 1 | 2 | 2 | — | ... |
| INVERSELY CONVERTED OR PRE-CONVERSION SIGNAL ($S_k$) | 00 | 11 | 01 | 11 | 00 | 00 | ... |
| PREDICTED POSITION (ELEMENTS TO BE ADDED TO GROUP B) | — | — | — | — | 4 | — | ... |

DATA COMPRESSION TECHNIQUES FOR REDUCING ENCODING BITS

FIELD OF THE INVENTION

The current invention is generally related to data compression, and more particularly related to data compression technologies based upon signal activation relationships.

BACKGROUND OF THE INVENTION

The entropy of signals is lowered by a conversion process that increases a certain signal series based upon the signal activation relationships. That is, subsequent to the above conversion of the information data, the initial information amount is compressed by entropy encoding. The compression effect is significant especially when a signal series containing a single signal frequently occurs. In addition, for a certain specific signal series, the information amount is further compressed by assigning an encoding word to the sequence. A prior art information conversion method of the above kind converts signals that exist after the second position from the beginning of a signal series that contains a single kind. For example, the prior art information conversion method such as "move-to-front" converts the signal into a certain predetermined signal such as 0. On the other hand, a post conversion signal varies for the front signal series containing a single kind. The post conversion signal depends upon a distance to a recent preceding equivalent signal or a number or kind of signals between the recent preceding equivalent signal and the current signal.

One exemplary conversion technique is disclosed in "A locally adaptive data compression scheme," by Jon Louis Bentley, Daniel D. Sleator, Robert E. Tarjan and Victor K. Wei, Communication of the ACM, Vol. 29, No. 4, pp. 320–330, April (1986). The current signal is converted to a distance between the current signal and the recent preceding equivalent signal. The above distance assumes that the length of the repeated equivalent signal series is the length of the single signal.

Another prior art, Japanese Patent No. 2,722,665 discloses a bit rate reduction method. In the bit reduction method, a Huffman encoding word is generated based upon a combination of a most frequently repeated signal A and other signals that precede or proceed the signal A.

The above described Huffman encoding is generated for the signal series that have been converted based upon the signal activation relationships. In the combined use of the Huffman encoding and the signal activation based conversion, a Huffman encoding word is required to have each of the combinations of the signals A and the preceding signals. It is desirable to reduce the number of necessary Huffman encoding words that correspond to the combinations of prediction signals and other signals.

SUMMARY OF THE INVENTION

In order to solve the above and other problems, according to a first aspect of the current invention, a method of reducing a number of bits in data compression, including the steps of: converting repeated data in a signal sequence based upon a length between two of the repeated data, a number of the repeated data and a kind of the repeated data to generate converted data, the converted data having an activation sequence number k being referenced by $t_k$; selecting a predetermined signal a; predicting a Group B that contains elements each representing the activation sequence number k for a portion of the converted data that contains none of the predetermined signal a, the portion of the converted data also having an inversely converted value that is equal to that of the predetermined signal a, the portion of the converted data being defined as a marking signal; comparing the activation sequence k to all of the converted data except for a portion containing the predetermined signal A the elements in the Group B to generate a comparison result; and assigning a predetermined encoding word to the corresponding portion of the converted data $t_k$ based upon the comparison result.

According to a second aspect of the current invention, a computer program including instructions for reducing a number of encoding words in data compression, including the tasks of: converting repeated data in a signal sequence based upon a length between two of the repeated data, a number of the repeated data and a kind of the repeated data to generate converted data, the converted data having an activation sequence k being referenced by $t_k$; selecting a predetermined signal a; predicting a Group B that contains elements each representing the activation sequence number k for a portion of the converted data that contains none of the predetermined signal a, the portion of the converted data also having an inversely converted value that is equal to that of the predetermined signal a, the portion of the converted data being defined as a marking signal; comparing the position k to all of the converted data except for a portion containing the predetermined signal A the elements in the Group B to generate a comparison result; and assigning a predetermined encoding word to the corresponding portion of the converted data $t_k$ based upon the comparison result.

These and various other advantages and features of novelty which characterize the invention are pointed out with particularity in the claims annexed hereto and forming a part hereof. However, for a better understanding of the invention, its advantages, and the objects obtained by its use, reference should be made to the drawings which form a further part hereof, and to the accompanying descriptive matter, in which there is illustrated and described a preferred embodiment of the invention.

BRIEF DESCRIPTION OF THE DRAWINGS

FIG. 5 is a table illustrating exemplary data in the dictionary after the above preferred process as described in FIG. 4 according to the current invention.

FIG. 8 is a table illustrating exemplary data after the information conversion signal $t_k$ as described in FIG. 5 according to the current invention.

DETAILED DESCRIPTION OF THE PREFERRED EMBODIMENT(S)

Based upon incorporation by external reference, the current application incorporates all disclosures in the corresponding foreign priority document (Japanese Patent Applications 01-3968 and 01-9697) from which the current application claims priority.

Figure 1:
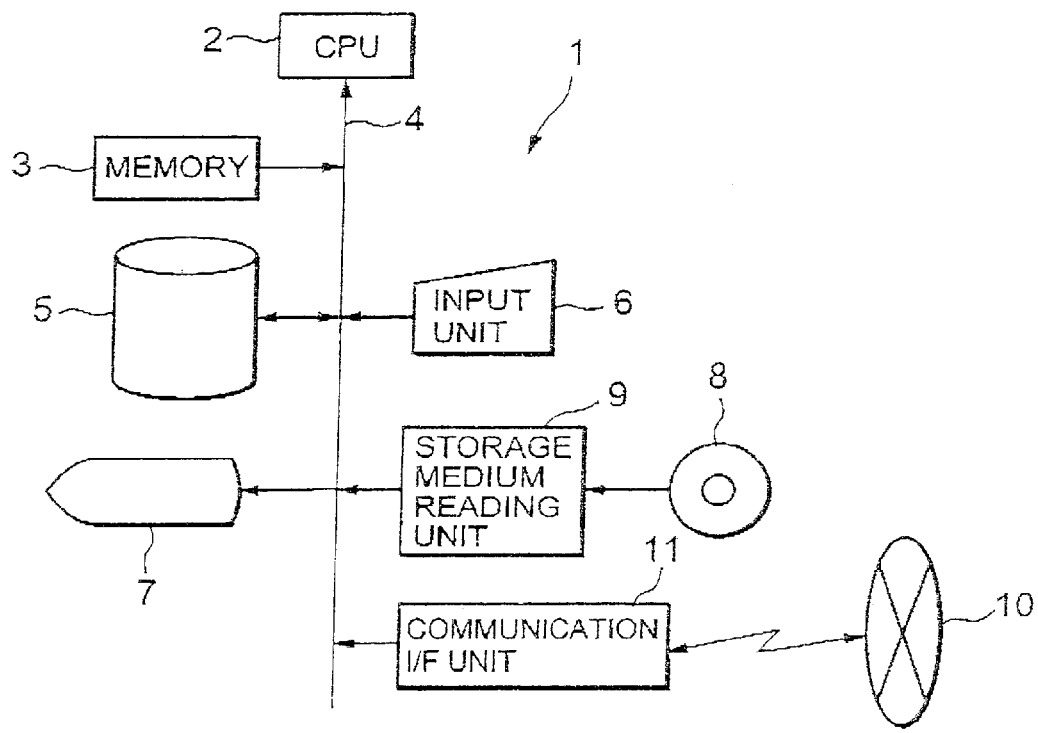
FIG. 1 is a diagram illustrating electrical connections in one preferred embodiment of the data compression device according to the current invention.

Referring now to the drawings, wherein like reference numerals designate corresponding structures throughout the views, and referring in particular to FIG. 1, a diagram illustrates electrical connections in one preferred embodiment of the data compression device according to the current invention. The data compression device 1 is generally a computer such as a personal computer (PC) and includes a central processing unit (CPU) 2 for calculating and centrally controlling other parts, a memory unit 3 including various ROM's and RAM's and bus that connect the above units. The bus 4 further connects a magnetic memory device 5 such as a hard disk unit through a predetermined interface, an input unit 6 such as a mouse and a keyboard, a display unit 7 such as a LCD and a CRT, a recording medium 8 such as an optical disk, a recording medium device drive 9 and a predetermined communication interface 11 for communicating with a network 10 such as the Internet. The recording media 8 include various types of media such as floppy disks, opto-magneto disks and optical disks like CD and DVD. Depending upon the recording medium, the recording medium device drive 9 includes an optical disk drive, an opto-magneto disk drive and a floppy disk drive.

Still referring to FIG. 1, the magnetic memory device 5 contains a software program that contains the computer instructions to perform the data compression according to the current invention. The recording medium device drive 9 reads the software program form the recording medium 8 that is installed in the magnetic memory device 5. Alternatively, the software program according to the current invention is installed in the magnetic memory device 5 by downloading from a network such as the Internet. The data compression software is implemented as an application program or a part of operating system software. The data compression device 1 is thus enabled to operate the data compression by the above described installing procedure.

Figure 2:
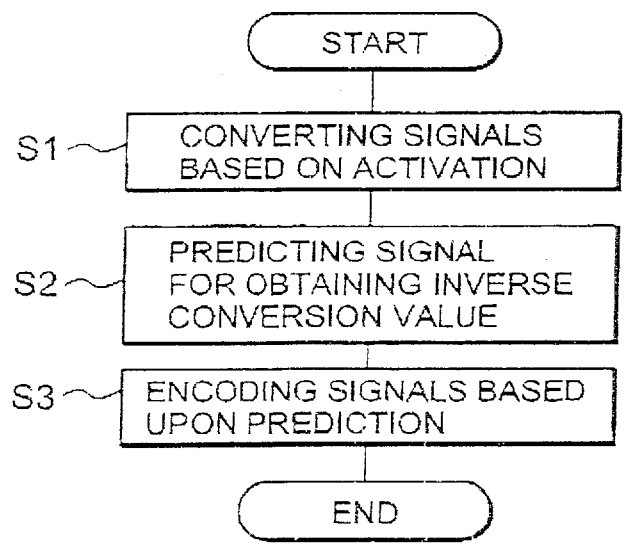
FIG. 2 is a flow chart illustrating general steps involved in a preferred process of compressing data according to the current invention.

Now referring to FIG. 2, a flow chart illustrates general steps involved in a preferred process of compressing data according to the current invention. The preferred process is performed by the above described data compression device 1 based upon the data compression software program. In a step S1, the CPU 2 converts the output signal series from a predetermined data source based upon the information related to the position or the relative position of signals. In a step S2, the relative position is predicted or detected for a signal by obtaining an inverse conversion value for a predetermined signal A in the above converted signal series. In a step S3, the previously converted signal series is further encoded based upon the above prediction or detection.

Figure 3:
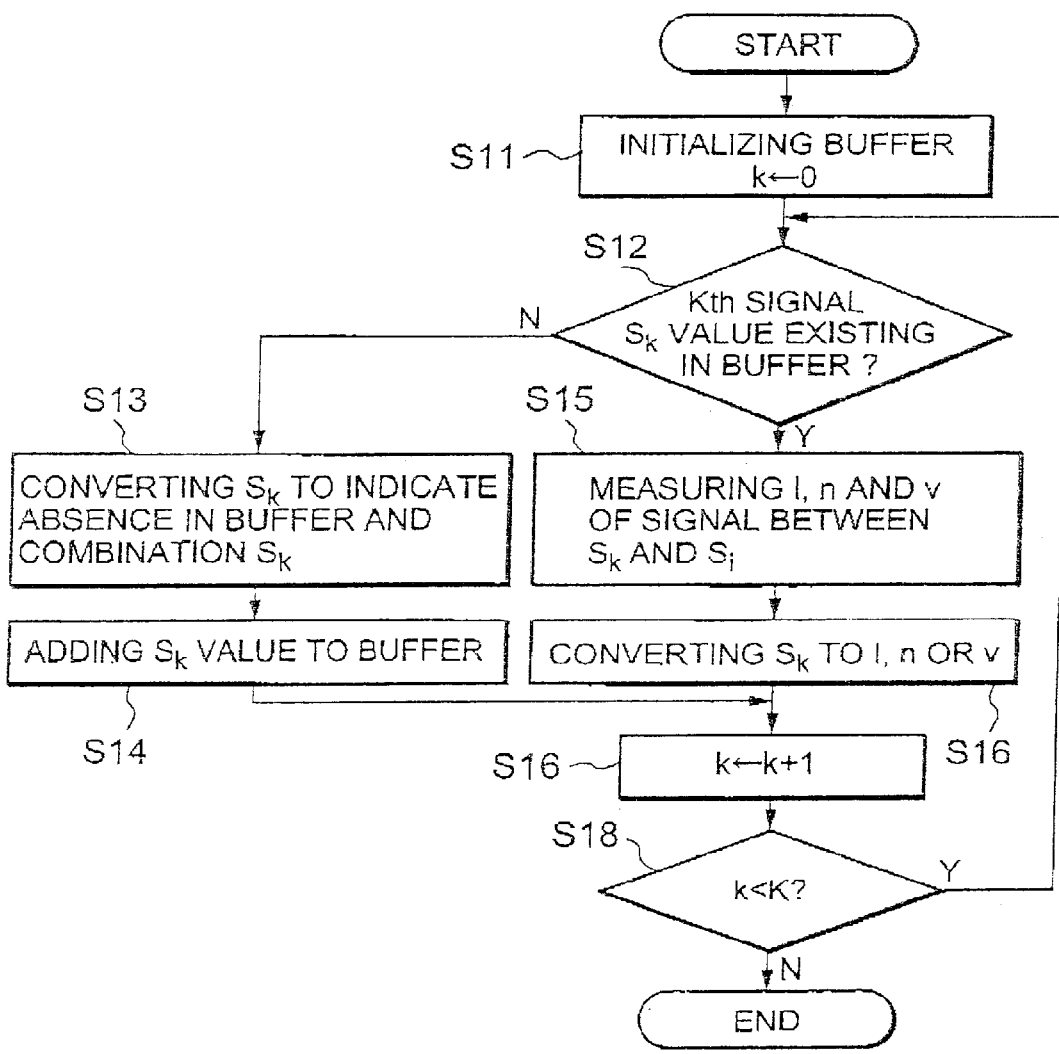
FIG. 3 is a flow chart illustrating steps involved in a preferred process of converting a signal preceding the current signal that is stored in a memory buffer according to the current invention.
Figure 4:
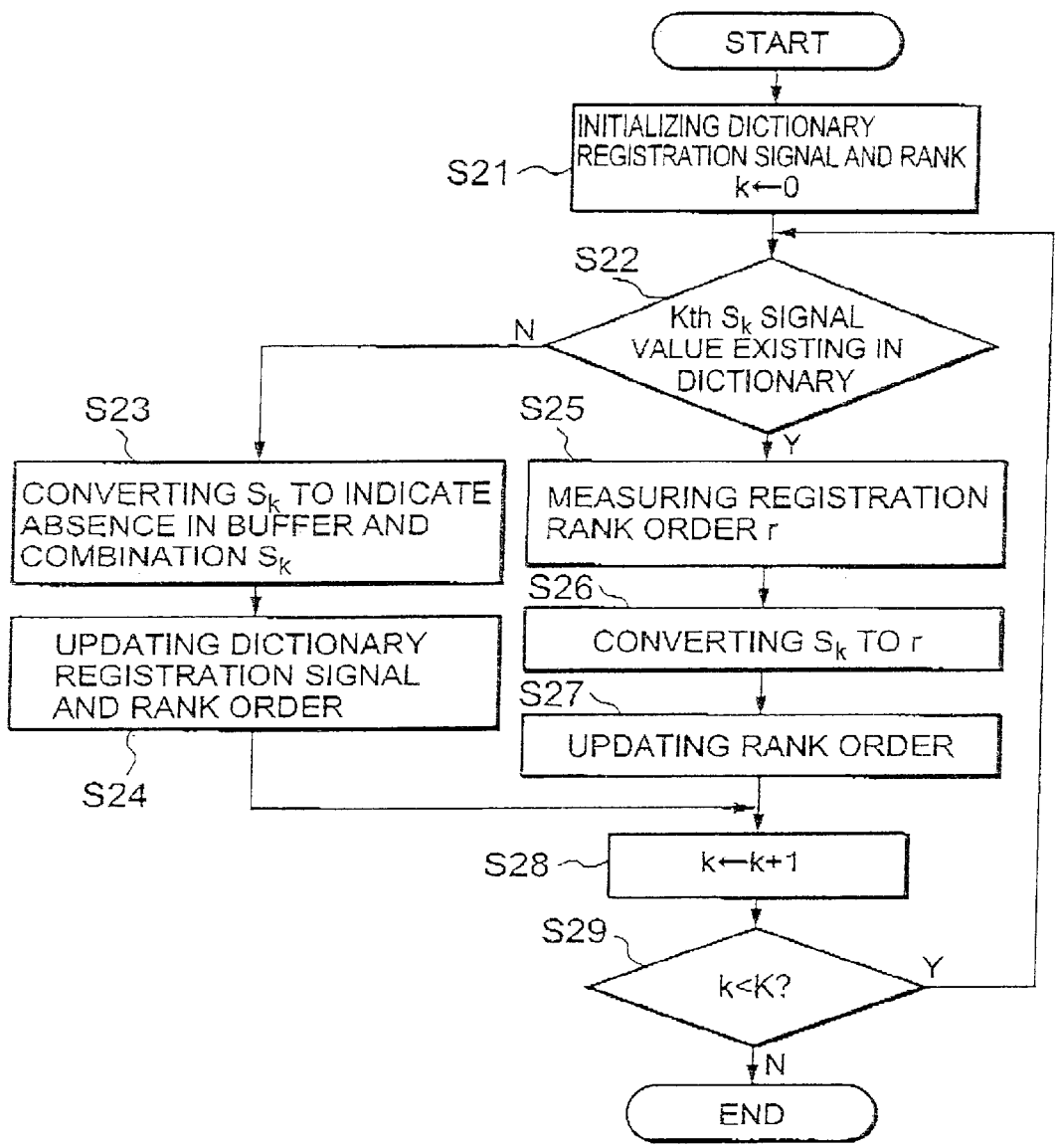
FIG. 4 is a flow chart illustrating steps involved in a preferred process of converting a signal using a dictionary that registers the order according to the current invention.

In general, FIGS. 3 and 4 illustrate steps involved in a preferred process of the above step S1 of FIG. 2 according to the current invention. The inputted signal series is converted based upon its signal positional relationships. The conversion is not limited to a particular algorithm, but includes a process such as "move-to-front." A predetermined value K indicates a total number of the signals.

Now referring to FIG. 3, a flow chart illustrates steps involved in a preferred process of converting a signal preceding the current signal that is stored in a memory buffer according to the current invention. In a step S11, a buffer and a variable K are initialized. The buffer exists at a predetermined area in the memory unit. The variable K is used to indicate the position. The initialization clears the content of the memory locations for the buffer and the variable K. In a step S12, a signal $S_k$ that occurs at the kth position is compared to signals in the buffer. It is determined whether or not a signal having the same value as the signal $S_k$ exists in the buffer. When it is determined in the step S12 that the above described signal fails to exist in the buffer, a pair of a signal indicative of the absence and the signal $S_k$ is converted in a step S13. Subsequently, the signal $S_k$ value is added in the buffer in a step S14. On the other hand, when it is determined in the step S12 that the above described signal exists in the buffer, the series length l, the number n or the kind v is measured in a step S15 for the signals between the signal $S_k$ and a recent signal $S_i$ that precedes the signal $S_k$ and has the same signal $S_k$ value. That is, $S_i = S_k$ where i<k. In the above measurement, it is assumed that the repeated same-value signals are measured in a single length and that the number of the repeated same-value signals is one. In a step S16, the signal $S_k$ is converted in the series length information l, the number information n or the kind information v. After the above step S14 or S16, the variable k is incremented by one in a step S17, and the incremented variable k is compared to a predetermined value K in a step S18. If it is determined in the step S18 that the variable k is smaller than the predetermined value K, the preferred process returns to the step S12 in order to repeat the above described steps S112 through S18. On the other hand, if it is determined in the step S18 that the variable k is not smaller than the predetermined value K, the preferred process terminates.

Now referring to FIG. 4, a flow chart illustrates steps involved in a preferred process of converting a signal using a dictionary that registers the order or position according to the current invention. In a step S21, a dictionary and its rank order are initialized. The dictionary registers every value or limits a number of registrations. A variable k indicates a signal position, and the variable k is also initialized in the step S21. The initialization in the step S21 involves the registration of predetermined signals in a predetermined order. In a step S22, a signal $S_k$ that occurs in the kth order or at the kth position is compared to signals in the dictionary. It is determined whether or not a signal having the same value as the signal $S_k$ exists in the in the dictionary. When it is determined in the step S22 that the above described signal fails to exist in the dictionary, a pair of a signal indicative of the absence and the signal $S_k$ is converted in a step S23. Subsequently, the signal to be registered and its order are updated in the dictionary in a step S24. For example, after the lowest ranked signal is removed from the dictionary, the ranked order of every registered signal is decremented by one, and the signal $S_k$ value is registered at the top in the dictionary in a step S24. On the other hand, when it is determined in the step S22 that the above described signal exists in the dictionary, rank information r is measured for a signal having the signal $S_k$ value in a step S25. In a step S26, the signal $S_k$ is converted in the rank information r. In a step 27, the rank order of the signals is updated in the dictionary. For example, the ranked order of the registered signals having above the signal $S_k$ value is decremented by one, and the signal $S_k$ value is registered at the top in the dictionary in a step S24. After the above step S24 or S27, the variable k is incremented by one in a step S28, and the incremented variable k is compared to a predetermined value K in a step S29. If it is determined in the step S29 that the variable k is smaller than the predetermined value K, the preferred process returns to the step S22 in order to repeat the above described steps S22 through S28. On the other hand, if it is determined in the step S29 that the variable k is not smaller than the predetermined value K, the preferred process terminates.

Now referring to FIG. 5, a table illustrates exemplary data in the dictionary after the above preferred process as described in FIG. 4 according to the current invention. The dictionary registers every signal having a unique value. In the preferred process, the data is initialized to the registration order as shown in a first column where the position k is 0. A data is stippled in the rank information r to indicate the rank order before updating with respect to the current signal $S_k$ and the registered signals having the signal $S_k$ value. For example, a signal having the position 0 and value 00 is converted to have a rank order 0 whose corresponding signal value is 00. After the conversion, the signals above the registered signal value 00 is decremented by one, and the signal having the value 00 is registered at the top. The updated registration order is shown in the column of the position 1. Subsequently, a signal having the position 1 and the value 11 is converted to the rank order 3. After the conversion, the rank order of every signal above value 11 is decremented by one, and the signal 11 is registered at the top as shown in the updated position column 2. The above described conversion and the dictionary update are repeated. In the repetitions, the signal signal $S_k$ is converted to a signal $t_k$.

Figure 6:
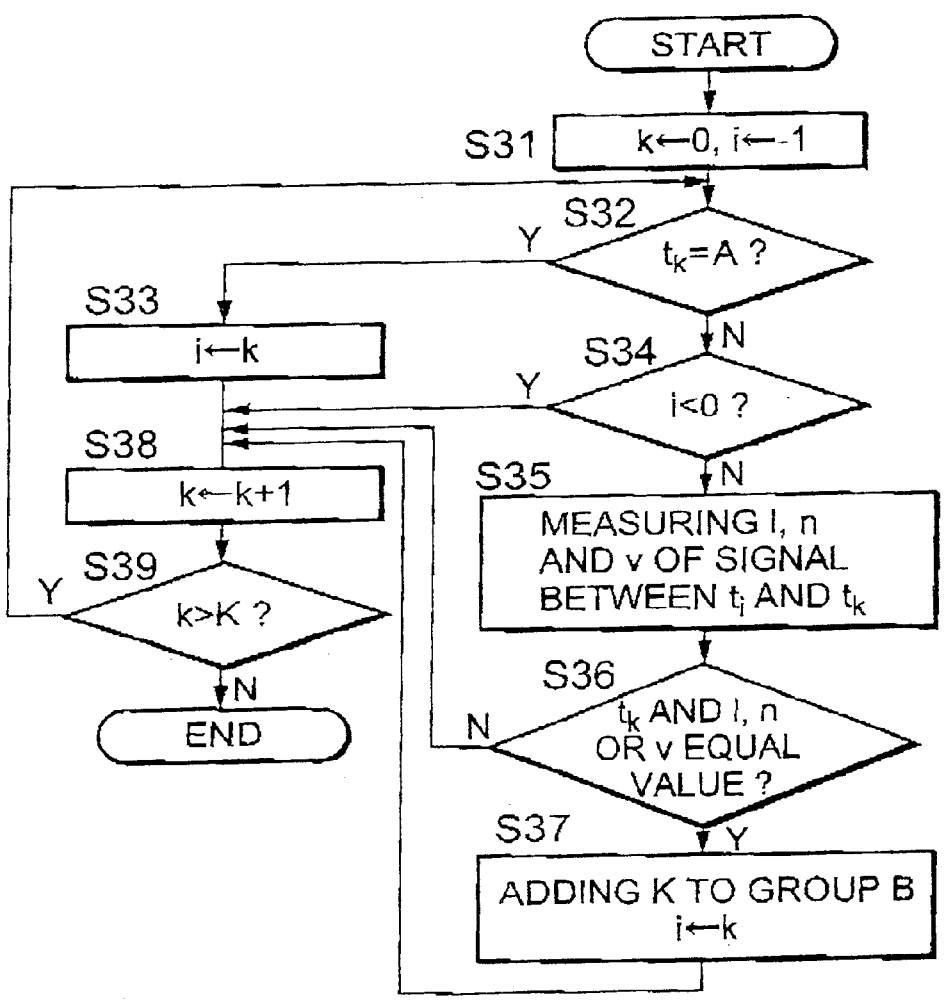
FIG. 6 is a flow chart illustrating steps involved in a preferred process of converting a signal without a dictionary for registering an inversely converted value according to the current invention.
Figure 7:
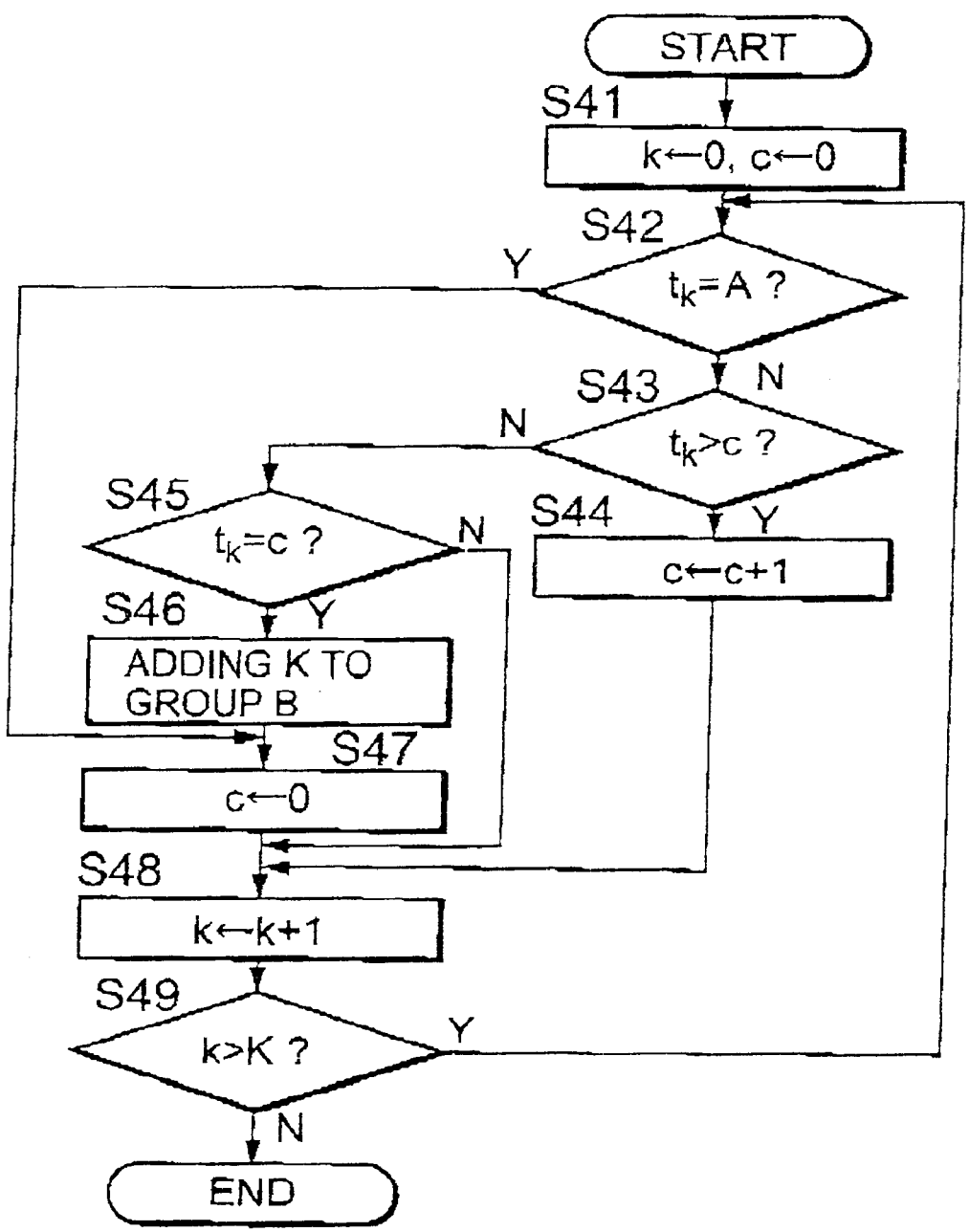
FIG. 7 is a flow chart illustrating steps involved in a preferred process converting a signal with a dictionary for registering an inversely converted value according to the current invention.

The step 2 of predicting a signal as shown in FIG. 2 is further illustrated in FIGS. 6 and 7. In general, the prediction steps predict the activation sequence of a signal that has an inversely conversed value of a predetermined signal A. For example, the predetermined signal A is defined to be the most frequently occurring signal.

Now referring particularly to FIG. 6, a flow chart illustrates steps involved in a preferred process of converting a signal without a dictionary for registering an inversely converted value according to the current invention. Assuming that variables to indicate the position are k and i, the variables k and i are respectively initialized to 0 and −1 in a step S31. In a step S32, the kth activated signal $t_k$ is compared to a predetermined signal A. If it is determined in the step S32 that the signal $t_k$ is equal to a predetermined signal A, the value of the variable k is placed in the variable i in a step S33. In a step S38, the variable k is incremented by one. In a step S39, the variable k is compared to a predetermined value K. If it is determined in the step S39 that the variable k is smaller than the predetermined value K, the preferred process returns to the step 32. On the other hand, if it is determined in the step S39 that the variable k is not smaller than the predetermined value K, the preferred process terminates its process.

Still referring to FIG. 6, if it is determined in the step S32 that the signal $t_k$ is not equal to a predetermined signal A, the preferred process proceeds to a step S34, where the variable i value is compared to zero. If it is further determined that the variable i contains a value smaller than zero in the step S34, the preferred process proceeds to the above described step S38. On the other hand, if it is determined that the variable i fails to contain a value smaller than zero in the step S34, the series length l, the number n or the kind v is measured from the signals between the signal $t_k$ and the signal t, in a step S35. In the above measurement, it is assumed that the repeated same-value signals are measured in a single length and that the number of the repeated same-value signals is one. It is also assumed that a number of signals is one for repeated signals that yield the same inversely converted value. The above two assumptions are optionally taken for the above measurement. In a step S36, the signal value $t_k$ is compared to the series length l, the number n or the kind v. If it is determined in the step S36 that the signal value $t_k$ is not equal to the series length l, the number n or the kind v, the preferred process proceeds to the above step S38. On the other hand, if it is determined in the step S36 that the signal value $t_k$ is equal to the series length l, the number n or the kind v, the variable k is added as an element in Group B in a step S37. The Group B contains elements that represent the position of the signals that yield the inversely converted value of the signal A. In the step S37, the value of the variable k is placed in the variable i.

Now referring to FIG. 7, a flow chart illustrates steps involved in a preferred process converting a signal with a dictionary for registering an inversely converted value according to the current invention. Assuming that variables to indicate the position are k and c, the variables k and c are both initialized to 0 in a step S41. The variable c particularly indicates the position of a signal having the same inversely converted value of the predetermined signal a. In a step S42, the kth signal $t_k$ is compared to a predetermined signal A. If it is determined in the step S42 that the signal $t_k$ is equal to a predetermined signal A, the preferred process proceeds to a step S47. In the step 47, the variable c is initialized to zero.

Still referring to FIG. 7, if it is determined in the step S42 that the signal $t_k$ is not equal to a predetermined signal A, the preferred process proceeds to a step S43, where the signal $t_k$ is compared to the variable c. If it is further determined that the signal $t_k$ contains a value larger than the variable c in the step S43, the preferred process proceeds to a step S44, where the variable c is incremented by one. On the other hand, if it is further determined in a step S43 that the signal $t_k$ fails to contain a value larger than the variable c, it is determined whether or not the signal $t_k$ contains a value equal to the variable c. If it is determined in the step S45 that the signal $t_k$ contains a value equal to the variable c, the variable k is added as an element in Group B in a step S46. The Group B contains elements that represent the position of the signals that yield the inversely converted value of the signal A. On the other hand, if it is determined in the step S45 that the signal $t_k$ fails to contain a value equal to the variable c, the preferred process proceeds to the step S48. In the step S48, the variable k is incremented by one. In the step S49, the variable k is compared to a predetermined value K. If it is determined in the step S49 that the variable k is larger than the predetermined value K, the preferred process returns to the step 42. On the other hand, if it is determined in the step S49 that the variable k is not larger than the predetermined value K, the preferred process terminates its process.

Referring to FIG. 8, a table illustrates exemplary data after the information conversion signal $t_k$ as described in FIG. 5 according to the current invention. A signal 0 is assigned to the predetermined signal A. The table shows the rank order of a signal having an inversely converted value that is equal to that of a recent signal 0 preceding the current signal. In the rank order column, the updated rank order c is shown in stippled cells. Since the value of the ranked signals in the dictionary is not necessary for the prediction, the value is not shown in the table. In the above example, it is determined that the signal 0 having the position 0 is equal to the predetermined signal 0. The rank order c indicates the registered order of the signal having the equal inversely converted value of the current signal 0 having the position 0, and the rank order c is initialized to zero. Since the signal 3 with the position 1 has a larger value than the rank order c, it is determined that the rank order will be decremented by one after update for the signal having an inversely converted value that is equal to that of the current signal 0 having the position 0. For this reason, the rank order value c is incremented by one but is not successfully predicted.

Subsequently, since the signal 2 with the position 2 has a larger value than the rank order value c being 1, it is determined that the rank order will be decremented by one after update for the signal having an inversely converted value that is equal to that of the current signal 0 having the position 0. For this reason, the rank order value c is incremented by one but is not successfully predicted. Since the signal 1 with the position 3 has a larger value than the rank order value c being 1, it is determined that the rank order will not change after update for the signal having an inversely converted value that is equal to that of the current signal 0 having the position 0. For this reason, the rank order value c remains the same but is not successfully predicted. Consequently, since the signal 2 with the position 4 has an equal value as the rank order c, it is determined that the inversely converted value of the signal 0 with the position 0 is equal to that of the current signal 2 having the position 4. When the converted signal $t_k$=the rank order c, the position of a predetermined signal is successfully established. For this reason, the rank order is now successfully predicted. In other words, the value 4 is added as a new element in the Group B, and the rank order value c is initialized. Subsequently, since it is determined that the signal 0 with the position 5 is the same as the predetermined signal 0, the rank order value c is initialized. The rank order c here indicates the rank order of a signal having an inversely converted value that is equal to that of the current signal 0 having the position 5.

Figure 9:
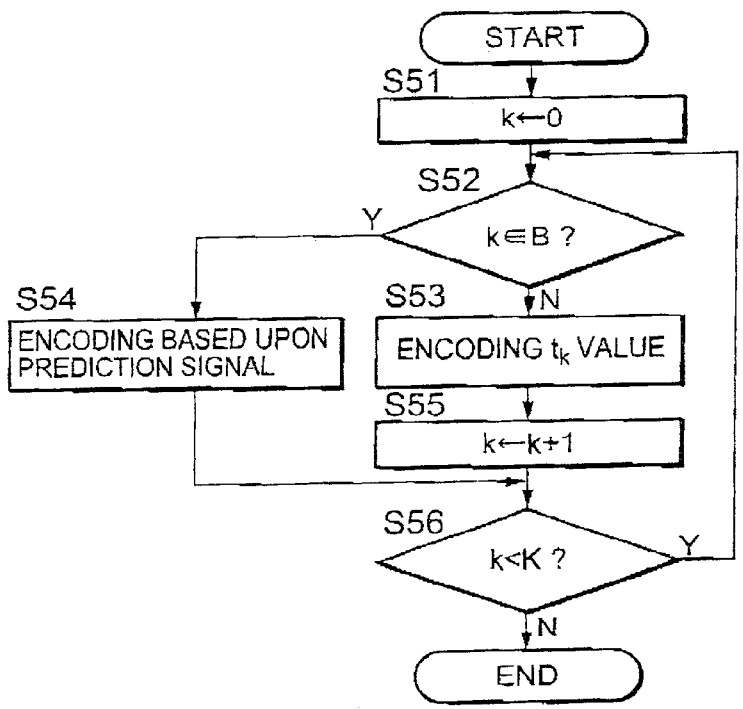
FIG. 9 is a flow chart illustrating steps involved in a preferred process of assigning a common encoding word to a signal with an activation sequence that belongs to the Group B according to the current invention.
Figure 10:
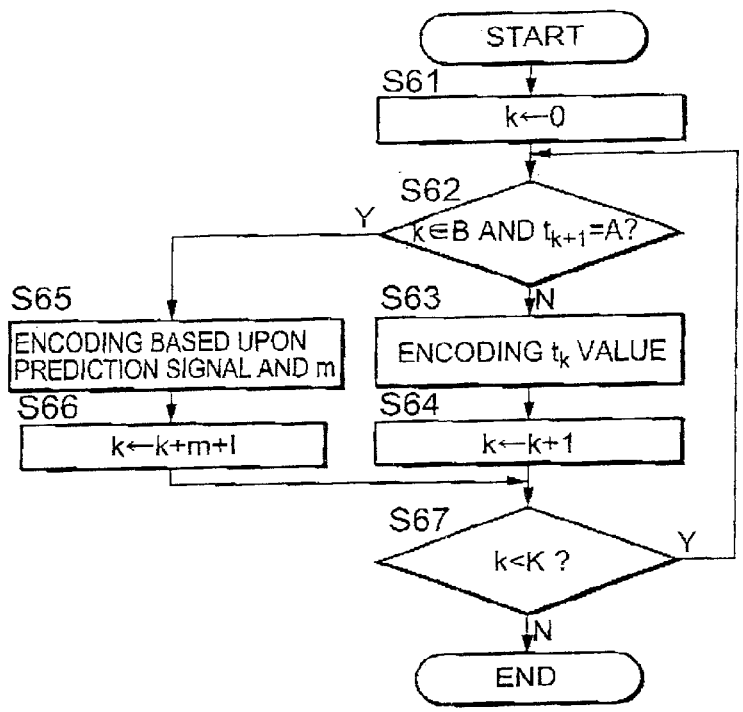
FIG. 10 is a flow chart illustrating steps involved in a preferred process of assigning a single encoding word to a signal with an activation sequence that belongs to the Group B that is located at the tail end of a signal series according to the current invention.

The step 3 of predicting a signal as shown in FIG. 2 is further illustrated in FIGS. 9 and 10. In general, the encoding steps assign a predetermined encoding word such as a Huffman encoding word to each signal.

Now referring particularly to FIG. 9, a flow chart illustrates steps involved in a preferred process of assigning a common encoding word to a signal with a position that belongs to the Group B according to the current invention. Assuming that $t_{k+1} \neq A$, when a step S52 is modified to a step S62 as shown in FIG. 10, the preferred process assigns a common encoding word to a signal belonging to the Group B and existing at the tail end of the signal series. In a step S51, a variable k for indicating the position is initialized to zero. In a step S52, the variable k value is compared to the Group B to determine whether or not the variable k is an element of the Group B. If it is determined in the step S52 that the variable k is an element of the Group B, a predetermined encoding word is assigned to $t_k$ to indicate a successful prediction in a step S54. The preferred process then proceeds to a step S56. On the other hand, if it is determined in the step S52 that the variable k is not an element of the Group B, an encoding word indicative of the current $t_k$ value is assigned to $t_k$ in a step S53. In a step S55, the variable k is incremented by one. Finally, it is determined in a step S56 whether or not the variable k has reached a predetermined value K. If the variable k has reached the predetermined value K, the preferred process terminates. On the other hand, if the variable k has not yet reached the predetermined value K, the preferred process repeats the above described steps S52 through S56.

Now referring particularly to FIG. 10, a flow chart illustrates steps involved in a preferred process of assigning a single encoding word to a signal with a position that belongs to the Group B and is located at the tail end of a signal series according to the current invention. In general, For a pair of a signal belonging to the Group B and at the tail end of a signal series that does not include a signal A and the following signal A, a single encoding word is assigned to the above pair signal. The single encoding word indicates a successful prediction and the continuous length m of the signal A. Similarly, for a pair of a signal belonging to the Group B and at the tail end of a signal series that does not include a signal A and a recent signal series for the preceding signal A, a single encoding word is assigned to the above pair signal to indicate a successful prediction and the continuous length m of the signal A. The encoding assignment of the above single encoding word is also applicable to a pair of positional signals belonging to the Group B and an immediately preceding or proceeding signal to indicate a successful prediction and the immediate position.

Still referring to FIG. 10, each of the steps is described. In a step S61, a variable k for indicating the activation sequence is initialized to zero. In a step S62, the variable k value is compared to the Group B to determine whether or not the variable k is an element of the Group B. At the same time, in the step S62, the variable $t_{k+1}$ value is compared to the predetermined value A to determine whether or not the variable $t_{k+1}$ is equal to the predetermined value A. If it is determined in the step S62 that the variable k is an element of the Group B and the variable $t_{k+1}$ is equal to the predetermined value A at the same time, an encoding word is assigned to a pair of signals in a step S65. The pair of the signals includes a first signal $t_k$ and a second signal $t_{k+j}$. The second signal $t_{k+j}$, follows the signal a and has the equal value as the signal a. That is, $t_{k+j}$=A where j=1, 2, . . . , m. The encoding word in the step S65 indicates a successful prediction and the continuous length m of the signal A. The preferred process then proceeds to a step S66, where the variable k is assigned to k+m+1. The preferred process further proceeds to a step S67. On the other hand, if it is determined in the step S62 that the variable k is not an element of the Group B or the variable $t_{k+1}$ is not equal to the predetermined value A, an encoding word indicative of the current $t_k$ value is assigned to $t_k$ in a step S63. In a step S64, the variable k is incremented by one. Finally, it is determined in a step S67 whether or not the variable k has reached a predetermined value K. If the variable k has reached the predetermined value K, the preferred process terminates. On the other hand, if the variable k has not yet reached the predetermined value K, the preferred process repeats the above described steps S62 through S67.

It is to be understood, however, that even though numerous characteristics and advantages of the present invention have been set forth in the foregoing description, together with details of the structure and function of the invention, the disclosure is illustrative only, and that although changes may be made in detail, especially in matters of shape, size and arrangement of parts, as well as implementation in software, hardware, or a combination of both, the changes are within the principles of the invention to the full extent indicated by the broad general meaning of the terms in which the appended claims are expressed.

What is claimed is:

1. A method of reducing a number of encoding words in data compression, comprising the steps of:
   converting repeated data in signal sequence based upon a length between two of the repeated data, a number of the repeated data and a kind of the repeated data to generate converted data, a portion of the converted data having an activation sequence number k being referenced by $t_k$;
   selecting a predetermined signal a;
   predicting a Group B that contains elements each representing the activation sequence number k for a portion of the converted data $t_k$ that contains none of the predetermined signal a, the portion of the converted data also having an inversely converted value that is equal to that of the predetermined signal a, the portion of the converted data being defined as a marking signal;
   comparing the position k of all of the converted data except for a portion containing the predetermined signal A to the elements in the Group B to generate a comparison result; and
   assigning a predetermined encoding word to the corresponding portion the converted data $t_k$ based upon the comparison result.

2. The method of reducing a number of encoding words in data compression according to claim 1 wherein the predetermined encoding word is a single common encoding word to be assigned to the converted data $t_k$ whose sequence number is represented by the elements in the Group B.

3. The method of reducing a number of encoding bits in data compression according to claim 2 wherein the converted data $t_k$ is located at a tail end of a series.

4. The method of reducing a number of encoding words in data compression according to claim 1 wherein said comparing step further includes an additional step of comparing second converted data $t_{k+1}$ whose activation number is k+1 to the predetermined value a to generate the comparison result.

5. The method of reducing a number of encoding words in data compression according to claim 4 wherein a corresponding one of the predetermined encoding words is assigned to a pair of the second converted data $t_{k+1}$ and the converted data $t_k$.

6. The method of reducing a number of encoding words in data compression according to claim 5 wherein the corresponding encoding word also reflects a length m of the second converted data $t_{k+1}$.

7. The method of reducing a number of encoding words in data compression according to claim 6 wherein the corresponding encoding word additionally reflects the second converted data $t_{k+1}$ that is located adjacent to the marking signal.

8. The method of reducing a number of encoding words in data compression according to claim 1 wherein said predicting step is further based upon the marking signal and a length l between the marking signal and the predetermined signal a.

9. The method of reducing a number of encoding words in data compression according to claim 1 wherein said predicting step is further based upon the marking signal and a length l between the marking signal and a signal represented by the activation number k in the Group B.

10. The method of reducing a number of encoding words in data compression according to claim 1 wherein said predicting step is further based upon the marking signal and a number n of signals between the predetermined signal a and the marking signal.

11. The method of reducing a number of encoding words in data compression according to claim 1 wherein said predicting step is further based upon the marking signal and a number n of signals between the marking signal and a signal represented by the activation number k in the Group B.

12. The method of reducing a number of encoding words in data compression according to claim 1 wherein said predicting step is further based upon the marking signal and a kind v of the inversely converted value for signals between the predetermined signal a and the marking signal.

13. The method of reducing a number of encoding words in data compression according to claim 1 wherein said predicting step is further based upon the marking signal and a kind v of the inversely converted value for signals between the marking signal and a signal represented by the activation number k in the Group B.

14. The method of reducing a number of encoding words in data compression according to claim 1 wherein said predicting step is further based upon the marking signal and a rank order r of the inversely converted value of the predetermined signal a.

15. The method of reducing a number of encoding words in data compression according to claim 1 wherein said predicting step is further based upon the marking signal and a rank order r of signals between the marking signal and a signal represented by the activation number k in the Group B.

16. A computer program including instructions for reducing a number of encoding words in data compression, comprising the tasks of:
   converting repeated data in signal sequence based upon a length between two of the repeated data, a number of the repeated data and a kind of the repeated data to generate converted data, a portion of the converted data having an activation sequence number k being referenced by $t_k$;
   selecting a predetermined signal a;
   predicting a Group B that contains elements each representing the position k for a portion of the converted data that contains none of the predetermined signal A, the portion of converted data also having an inversely converted value that is equal to that of the predetermined signal a, the portion of the converted data being defined as a marking signal;
   comparing the position k of all of the converted data except for a portion containing the predetermined signal A to the elements in the Group B to generate a comparison result; and
   assigning a predetermined encoding word to the corresponding portion of the converted data $t_k$ based upon the comparison result.

17. The computer program including instructions for reducing a number of encoding words in data compression according to claim 16 wherein the predetermined encoding word is a single common encoding word to be assigned to the converted data $t_k$ whose sequence number is represented by the elements in the Group B.

18. The computer program including instructions for reducing a number of encoding words in data compression according to claim 17 wherein the converted data $t_k$ is located at a tail end of a series in the marking signal.

19. The computer program including instructions for reducing a number of encoding words in data compression according to claim 16 wherein said comparing task further includes an additional task of comparing second converted data $t_{k+1}$ whose activation number is k+1 to the predetermined value a to generate the comparison result.

20. The computer program including instructions for reducing a number of encoding words in data compression according to claim 19 wherein a corresponding one of the predetermined encoding words is assigned to a pair of the second converted data $t_{k+1}$ and the converted data $t_k$.

21. The computer program including instructions for reducing a number of encoding words in data compression according to claim 20 wherein the corresponding encoding word also reflects a length m of the second converted data $t_{k+1}$.

22. The computer program including instructions for reducing a number of encoding words in data compression according to claim 21 wherein the corresponding encoding word additionally reflects the second converted data $t_{k+1}$ that is located adjacent to the marking signal.

23. The computer program including instructions for reducing a number of encoding words in data compression according to claim 16 wherein said predicting task is further based upon the marking signal and a length l between the marking signal and the predetermined signal a.

24. The computer program including instructions for reducing a number of encoding words in data compression according to claim 16 wherein said predicting task is further based upon the marking signal and a length l between the marking signal and a signal represented by the activation number k in the Group B.

25. The computer program including instructions for reducing a number of encoding words in data compression according to claim 16 wherein said predicting task is further based upon the marking signal and a number n of signals between the predetermined signal a and the marking signal.

26. The computer program including instructions for reducing a number of encoding words in data compression according to claim 16 wherein said predicting task is further based upon the marking signal and a number n of signals between the marking signal and a signal represented by the activation number k in the Group B.

27. The computer program including instructions for reducing a number of encoding words in data compression according to claim 16 wherein said predicting task is further based upon the marking signal and a kind v of the inversely converted value for signals between the predetermined signal a and the marking signal.

28. The computer program including instructions for reducing a number of encoding words in data compression according to claim 16 wherein said predicting task is further based upon the marking signal and a kind v of the inversely converted value for signals between the marking signal and a signal represented by the activation number k in the Group B.

29. The computer program including instructions for reducing a number of encoding words in data compression according to claim 16 wherein said predicting task is further based upon the marking signal and a rank order r of the inversely converted value of the predetermined signal a.

30. The computer program including instructions for reducing a number of encoding words in data compression according to claim 16 wherein said predicting task is further based upon the marking signal and a rank order r of signals between the marking signal and a signal represented by the activation number k in the Group B.

* * * * *